United States Patent
Zdebel et al.

(10) Patent No.: US 7,098,509 B2
(45) Date of Patent: Aug. 29, 2006

(54) HIGH ENERGY ESD STRUCTURE AND METHOD

(75) Inventors: Peter J. Zdebel, Austin, TX (US); Diann Michelle Dow, Austin, TX (US)

(73) Assignee: Semiconductor Components Industries, L.L.C., Phoenix, AZ (US)

(*) Notice: Subject to any disclaimer, the term of this patent is extended or adjusted under 35 U.S.C. 154(b) by 160 days.

(21) Appl. No.: 10/750,267

(22) Filed: Jan. 2, 2004

(65) Prior Publication Data
US 2005/0145945 A1 Jul. 7, 2005

(51) Int. Cl.
*H01L 23/62* (2006.01)
*H01L 29/72* (2006.01)
*H01L 29/74* (2006.01)
*H01L 31/111* (2006.01)
*H01L 29/76* (2006.01)

(52) U.S. Cl. .............. 257/355; 257/173; 257/174; 257/356; 257/357; 257/358; 257/359; 257/360; 257/361; 257/362; 257/401; 257/409

(58) Field of Classification Search ........ 257/173–174, 257/355–356, 360, 357–359, 361–363, 401, 257/409
See application file for complete search history.

(56) References Cited

U.S. PATENT DOCUMENTS

| | | | |
|---|---|---|---|
| 4,405,933 A | 9/1983 | Avery | |
| 5,212,398 A * | 5/1993 | Matsunaga et al. | 257/356 |
| 5,238,850 A * | 8/1993 | Matsunaga et al. | 438/234 |
| 5,517,224 A * | 5/1996 | Kaizu et al. | 347/59 |
| 5,545,909 A * | 8/1996 | Williams et al. | 257/355 |
| 5,594,266 A * | 1/1997 | Beigel et al. | 257/355 |
| 5,801,065 A * | 9/1998 | Rizvi et al. | 438/393 |
| 5,877,534 A | 3/1999 | Williams et al. | |
| 5,952,701 A * | 9/1999 | Bulucea et al. | 257/407 |
| 5,976,921 A * | 11/1999 | Maeda | 438/202 |
| 5,986,863 A * | 11/1999 | Oh | 361/56 |
| 6,040,604 A * | 3/2000 | Lauvray et al. | 257/355 |
| 6,060,752 A * | 5/2000 | Williams | 257/355 |
| 6,137,140 A * | 10/2000 | Efland et al. | 257/343 |
| 6,236,087 B1 * | 5/2001 | Daly et al. | 257/355 |
| 6,365,932 B1 * | 4/2002 | Kouno et al. | 257/341 |
| 6,441,437 B1 * | 8/2002 | Gossner | 257/355 |
| 6,570,229 B1 * | 5/2003 | Harada | 257/373 |

(Continued)

OTHER PUBLICATIONS

V. Vashchenko et al., "Comparison of ESD Protection Capability of Lateral BJT, SCR, and bi-directional SCR for Hi-Voltage BiCMOS Circuits," IEEE Bipolar/BiCMOS Circuits and Technology Meeting, pp. 181-184, Sep. 29-Oct. 1, 2002.

(Continued)

*Primary Examiner*—Ida M. Soward
(74) *Attorney, Agent, or Firm*—Keith B. Jackson

(57) ABSTRACT

In one embodiment, a concentric ring ESD structure includes a first p-type region and a second p-type region are formed in a layer of semiconductor material. The two p-type regions are coupled together with a floating n-type buried layer. The first and second p-type regions form a back-to-back diode structure with the floating n-type buried layer. A pair of shorted n-type and p-type contact regions is formed in each of the first and second regions. An isolation region is formed between the first and second p-type regions.

30 Claims, 5 Drawing Sheets

U.S. PATENT DOCUMENTS

| | | | | |
|---|---|---|---|---|
| 6,914,294 | B1* | 7/2005 | Nakamura et al. | 257/328 |
| 6,914,298 | B1* | 7/2005 | Hamazawa | 257/343 |
| 2002/0063266 | A1* | 5/2002 | Lee | 257/200 |
| 2002/0109191 | A1* | 8/2002 | Sato et al. | 257/355 |
| 2003/0230777 | A1* | 12/2003 | Kato et al. | 257/330 |
| 2004/0021180 | A1* | 2/2004 | Salling et al. | 257/371 |

OTHER PUBLICATIONS

Haigang Feng, et al,. "An ESD Protection Circuit for Mixed-Signal ICs," IEEE 2001 Custom Integrated Circuits Conference, pp. 493-496, May 6-9, 2001.

Ke Gong et al., "A Study of Parasitic Effects of ESD Protection on RF ICs," IEEE Transactions on Microwave Theory and Techniques, vol. 50, No. 1, pp. 393-402, Jan. 2002.

H.G. Feng et al., "Circular Under-Pad Multiple Mode ESD Protection Structure for ICs," Electronics Letters, vol. 38, No. 11, pp. 511-513, May 23, 2002.

Guang Chen et al., "A Systematic Study of ESD Protection Structures for RF ICs," 2003 IEEE Radio Frequency Integrated Cicuits Symposium, pp. 347-350, Jun. 8-10, 2003.

* cited by examiner

HIGH ENERGY ESD STRUCTURE AND METHOD

BACKGROUND OF THE INVENTION

This invention relates, in general, to integrated circuit protection structures, and more particularly to an electrostatic discharge (ESD) structure for protecting integrated circuits from extreme ESD conditions and a method of manufacture.

ESD is a well-known and documented problem in integrated circuit (IC) manufacturing and usage. ESD occurs when large voltage pulses from static electricity are applied to the I/O pads of integrated circuits. ESD voltage spikes may cause damage to insulating layers and conductive interconnects and integrated semiconductor devices, which can result in short and/or open circuit failures and overheating. Additionally, such spikes can damage junction regions causing cross diffusion and melting.

ESD protection has emerged as a major design challenge in certain high frequency applications such as radio frequency (RF), digital, and mixed signal integrated circuits. For all IC applications, higher failure voltages and smaller available areas for placing an ESD structure on an IC are driving factors for ESD performance levels. In addition, an ESD load often dominates the parasitic capacitance, which becomes a significant problem at higher operating frequencies. ESD device related parasitic capacitance slows signals down, causes large reflections, and limits chip-to-chip signal bandwidth. As a result, a significant part of a signal may be lost through ESD circuits, which makes them a major obstacle for high-speed operation.

Some industries, such as the automotive, computing, and personal communication industries, now require ESD testing and certification up to 20 kV, which puts higher demands and stresses on ESD structures. In particular, such stresses are troublesome in IC technologies incorporating bump structures on I/O pads where such stresses can lead to device degradation or failure.

Accordingly, ESD structures and methods are needed that can withstand $\geq 15$ kV air and contact discharge events, and that have mechanical robustness and long-term reliability. Additionally, it would be advantageous for such structures and methods to be easily integrated into typical IC process flows, to have reduced parasitic effects particularly for high frequency applications, and to take-up minimal space.

Figure 1:
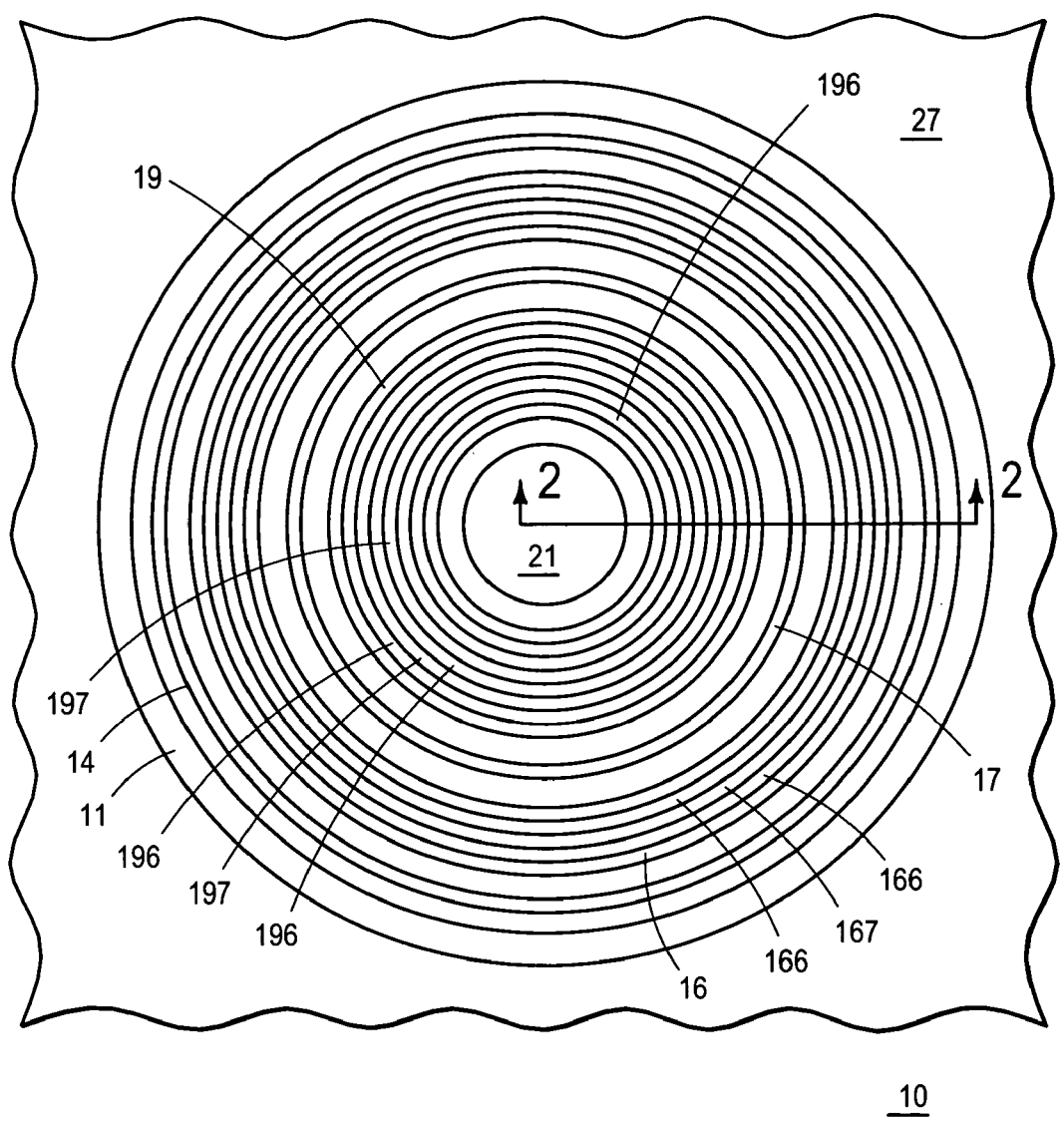
FIG. 1 is a top view of an ESD structure according to the present invention.

For ease of understanding, elements in the drawing figures are not necessarily drawn to scale, and like element numbers are used where appropriate throughout the various figures. Additionally, the terms first, second, third, and the like in the description and claims, if any, are used for distinguishing between elements and not necessarily for describing sequential or chronological order. It is understood that the terms so used are interchangeable under appropriate circumstances and that the embodiments of the invention described herein are capable of operation in other sequences that are described or illustrated herein.

DETAILED DESCRIPTION OF THE DRAWINGS

In general, the present invention provides an annular, annulated, ring, concentric ring, concentric circle, circular, or ring-like ESD structure for protecting integrated circuit devices from extreme voltage discharge events (i.e., $\geq 15$ kV air and contact discharge events. The ESD device comprises buried subsurface back-to-back diodes coupled together with a floating buried layer. An isolation region between the two diodes minimizes any current injection or SCR action between the two diodes. The ESD device according to the present invention exhibits low on-resistance, pico-amp leakage current levels, improved thermal energy dissipation, reduced I/O bump stress sensitivity, and low input capacitance. Also, a method for manufacturing the ESD structure is described.

One can better understand the present invention by referring to FIGS. 1–8 together with the following detailed description of the drawings. The preferred embodiment shown in the drawing figures is an ESD structure suitable for integration into a bipolar integrated circuit flow. This is not intended to be limiting, and the ESD structure according to the present invention can be incorporated into CMOS or BICMOS integrated circuit process flows.

Figure 2:
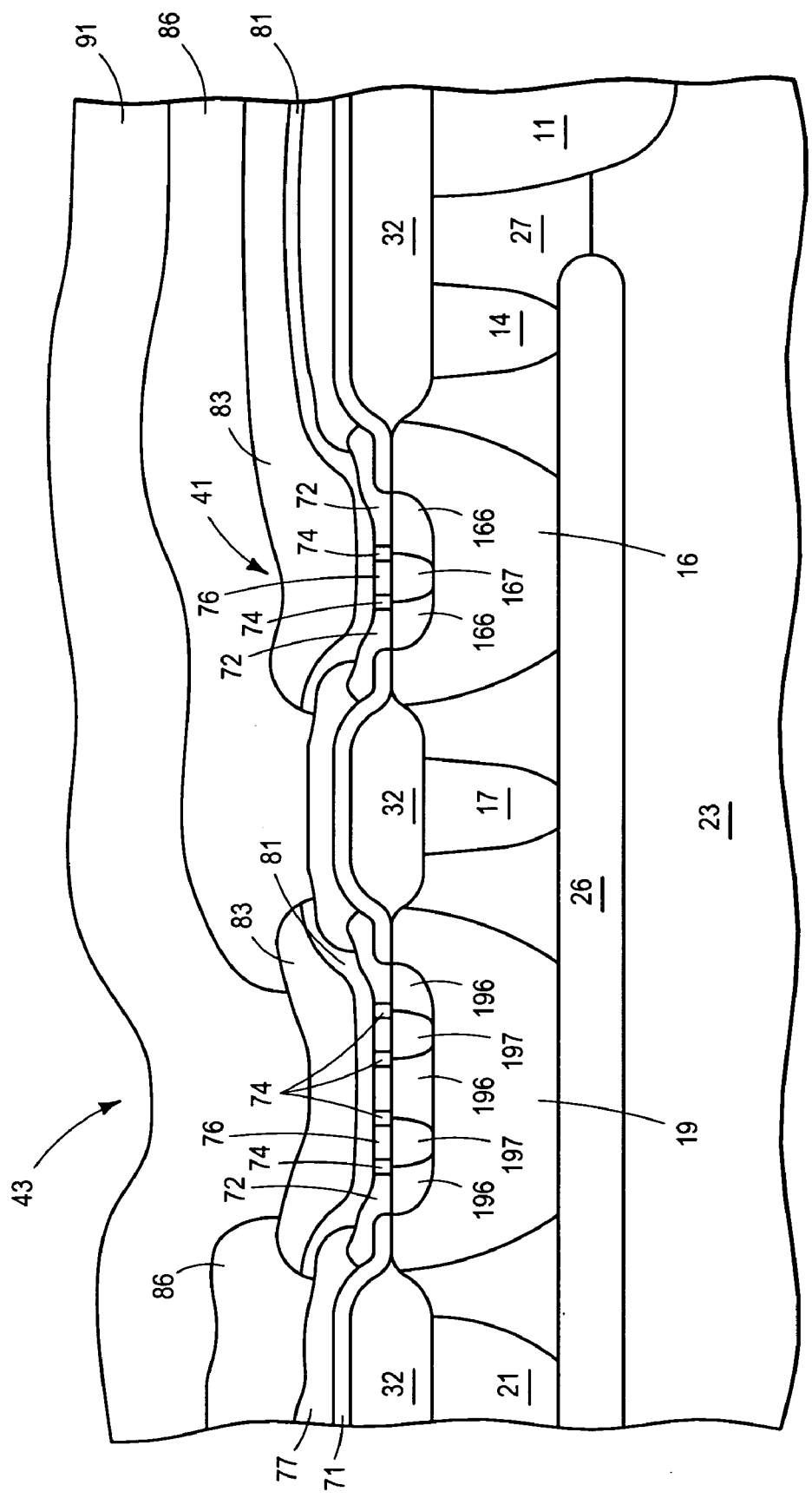
FIG. 2 is an enlarged cross-sectional view of the ESD structure of FIG. 1 taken along reference line 2—2.

FIG. 1 shows an enlarged top view of an annular, annulated, circular, concentric ring, or concentric circle ESD structure or device 10 according to the present invention formed on or as part of a semiconductor region or epitaxial layer 27. For ease of understanding, passivation and conductive layers have been removed from structure 10 in FIG. 1, but are shown in FIG. 2. Structure 10 includes an outer isolation ring or region 11, an outer or first isolation or diffused region or ring or trench isolation region 14, a first region or ring 16, a second isolation or diffused region or ring trench isolation region 17, a second region or ring 19, and an inner or third isolation or circular diffused or doped region or trench isolation region 21. Together with a buried region 26 (shown in FIG. 2), first and second regions comprise a back to back diode configuration according to the present invention.

In the embodiment shown, outer isolation ring 11 and first and second diode regions 16 and 19 comprise a first conductivity type (e.g., p-type). First, second, and third regions 14, 17, and 21 comprise a second conductivity type (e.g., n-type) when these regions are comprised of diffused isolation regions. The conductivity types of regions 14, 16, 17, 19, and 21 may be reversed. First, second and third regions 14, 17 and 21 alternatively comprise dielectrically filled trenches and are formed using conventional trench isolation techniques. Structure 10 comprises a concentric ring and/or circle shape to maximize ESD performance and minimize mechanical stresses associated with bumped I/O pads.

According to the present invention, region 17 functions to reduce, limit, or eliminate SCR action or current injection between first and second regions 16 and 19, which adds to the robustness of structure 10. Preferably, deep region 17 is doped so that after it is formed, it has a surface dopant concentration on the order of $1.0 \times 10^{18}$ atoms/cm$^3$. More preferably, the surface dopant concentration is greater than about $4.0 \times 10^{18}$ atoms/cm$^3$. This results in a dopant profile that is preferred in minimizing current injection or SCR action during operation.

Highly doped regions or contact regions or rings 166 of the first conductivity type and a highly doped region or contact region or ring 167 of the second conductivity type are formed in first region 16. In addition, highly doped regions or contact regions or rings 196 of the first conductivity type and highly doped or contact regions or rings 197 of the second conductivity type are formed in second region 19. More or less contact regions may be used. More contact regions are used together with wider diode regions for higher energy (voltage) ESD requirements. The preferred embodiment shown herein is suitable for greater than 20 kV requirements or certification. In an alternative embodiment, regions 166, 167, 196, and/or 197 are discontinuous regions to allow for, among other things, routing options.

FIG. 2 shows an enlarged partial cross-sectional view of structure 10 taken along reference line 2—2 shown in FIG. 1. Structure 10 is formed on, within, or as part of a semiconductor substrate, wafer, or region 23. Substrate 23 comprises, for example, a boron doped substrate with a dopant concentration on the order of $3.0\times10^{15}$ atoms/cm$^3$. A floating or buried layer or region 26 is formed on a portion of substrate 23, and epitaxial layer 27 is formed over substrate 23 and buried region 26. In the embodiment shown, buried region 26 comprises a highly doped n-type layer having a peak dopant concentration preferably on the order of $4.0\times10^{19}$ to $8\times10^{19}$ atoms/cm$^3$ to, among other things, minimize resistance. Preferably, buried region 26 comprises a circular or circle shape.

Buried region 26 preferably comprises an arsenic doped layer. Alternatively, buried region 26 comprises a phosphorous or antimony doped layer. Epitaxial layer 27 preferably comprises an arsenic doped layer with a dopant concentration on the order of $1.0\times10^{16}$ to $5.0\times10^{16}$ atoms/cm$^3$ and a thickness of about 0.5 to 1.1 micron, or larger. Alternatively, layer 27 comprises a phosphorous or antimony doped layer. Buried region 26 and epitaxial layer 27 are formed using conventional processing techniques.

As shown in FIG. 2, first, second, and third deep regions 14, 17, and 21 preferably extend through epitaxial layer 27 to contact or couple to buried region 26. Alternatively, regions 14, 17, and 21 extend far enough to minimize any SCR action or current injection between adjacent regions or devices. Also, first and second regions 16 and 19 extend through epitaxial layer 27 to contact buried layer 26 to form diode junction regions, or p/n or n/p junctions. Outer isolation ring 11 is shown as a diffused p-type isolation region, which is formed, for example, by selectively forming a p-type up region in a portion of substrate 23 using conventional masking and dopant techniques prior to growing epitaxial layer 27. For example, a boron implant on the order of $1.0\times10^{13}$ to $4.0\times10^{13}$ atoms/cm$^2$ is used to form the up region. After epitaxial layer 27 is grown, additional p-type dopant is diffused using conventional masking and dopant techniques to complete outer isolation ring 11. Alternatively, outer isolation ring 11 comprises trench isolation, a dielectric isolation, combinations thereof, or the like.

Field isolation regions 32 are selectively formed over epitaxial layer 27 leaving exposed portions above first and second regions 16 and 19 or through which first and second regions 16 and 19 are subsequently formed. Field isolation regions 32 comprise a dielectric material such as a silicon oxide, and are formed using, for example, localized oxidation of silicon (LOCOS) techniques or variations thereof, or a shallow trench. Preferably, field isolation regions 32 have a thickness on the order of about 7,000 to 10,000 Angstroms. Although the edges of first and second regions 16 and 19 are shown under field isolation regions 32, the edges may terminate inside or within the active region defined by field isolation regions 32. In this alternative embodiment, the edges are subsequently passivated using a dielectric layer (e.g., ILD 71 described below).

Contact regions 166 and 167 are formed in first region 16, and contact regions 196 and 197 are formed in second region 19. For example, contact regions 166 and 196 comprise highly doped p-type regions formed using boron ion implantation and conventional masking techniques. Contact regions 167 and 197 comprise highly doped n-type regions formed using arsenic or phosphorous ion implantation and conventional masking techniques. Alternatively, and as will be explained in more detail below, contact regions 166 and 196 are formed using a p-type polycrystalline semiconductor layer as a diffusion source, and contact regions 167 and 197 are formed using an n-type polycrystalline semiconductor layer as a diffusion source.

In a preferred embodiment suitable for greater than 20 kV ESD protection, second region 19 preferably comprises three rings of p-type contact regions 196 with an n-type contact ring 197 interposed between a pair of p-type contact regions 196. Additionally, first region 16 preferably comprises two rings of p-type contact regions 166 with an n-type contact ring 167 interposed in between. More or less contact regions may be used.

In addition, it is preferred that the area of first and second regions 16 and 19 at the interface (i.e., junction) of these regions with buried layer 26 be substantially equal. It is further preferred that the area of first and second regions 16 and 19 should be approximately 20,000 square microns each for a greater than 20 kV ESD device. For a greater than 15 kV ESD device, the area preferably is approximately 15,000 square microns. This relationship is scalable for other voltages as well. That is, if X corresponds to the desired ESD level in volts, then both first region 16 and second region 19 have an area at the interface with buried layer 26 substantially equal to X square microns.

By way of example, p-type contact regions 166 and 196 are formed with a boron implant dose in a range from about $1.0\times10^{15}$ to about $5.0\times10^{15}$ atoms/cm$^2$, and n-type contact regions 167 and 197 are formed with an arsenic implant dose in a range from about $1.0\times10^{16}$ to about $2.0\times10^{16}$ atoms/cm$^2$. Preferably, the areas of contact regions 166, 196, 167 and 197 are selected so that the contact regions support approximately an equal amount of carriers (i.e., holes and electrons) when one junction is under forward bias and the other junction is in avalanche. This provides, among other things, a lower on-resistance because transport current is supported in regions 16 and 19 due to the presence of regions 167 and 197 respectively. More particularly, regions 167 and 197 support or enable minority carrier transport current in structure 10. Without such regions, minority carrier current would become recombination current, which would slow down structure 10. Since avalanche conditions produce an equal number of holes and electrons, it is important that the dopant concentrations and areas (i.e., resistances) of regions 166, 167, 196 and 197 support a substantially equal number of carriers during a positive or negative ESD trigger event.

Additionally, the ESD trigger voltage of device 10 is the avalanche voltage of one diode plus the $V_{BE}$ of the other diode depending upon whether the trigger event is positive or negative. Since the avalanche temperature coefficient is positive and $V_{BE}$ temperature coefficient is negative the variation of the ESD trigger voltage over temperature is compensated, which provides device 10 with enhanced temperature compensation or stability. Also, because the trigger voltage is determined by the avalanche and $V_{BE}$ voltages, structure 10 is less susceptible to process variations and is thus more stable compared to other ESD structures.

In a preferred embodiment, the peripheral or diffused areas of regions 166 and 196 are about twice that of the peripheral areas of regions 167 and 197. That is, the peripheral area ratios of 166/167 and 196/197 are preferably about 2:1 to provide structure 10 with a more optimum current flow capability. In other words, the resistance of regions 167 and 197 is about twice the resistance of regions 166 and 196.

Structure 10 further includes a dielectric layer or interlayer dielectric (ILD) layer 71, which comprises, for example, an oxide, a nitride, or combinations thereof. In a preferred embodiment, dielectric layer 71 comprises a silicon nitride layer about 300 to 600 angstroms thick overlying a silicon oxide layer of about 500 to 700 angstroms thick. Conventional photolithographic techniques are used to pattern ILD layer 71 to form contact openings over first and second regions 16 and 19. A first contact structure 41 is formed over or on substrate 23, and is coupled to first region 16 through contact regions 166 and 167. A second contact structure 43 is formed over or on substrate 23, and is coupled to second region 19 through regions 196 and 197.

In a bipolar integrated circuit flow, first and second contact structures 41 and 43 comprise, for example, a first polycrystalline semiconductor (e.g., polysilicon) layer 72 of the first conductivity type above, adjacent, or overlying contact regions 166 and 196, and a second polycrystalline semiconductor layer (e.g., polysilicon) 76 of the second conductivity type, above, adjacent, or overlying contact regions 167 and 197. Optional dielectric spacers 74 separate polysilicon layers 72 and 76. Preferably, contact structures 41 and 43 include additional conductive layers, which will be described in more detail below. Contact structure 41 shorts contact regions 166 and 167 together, and contact structure 43 shorts contact regions 196 and 197 together to effectively short the pn junctions formed by the contact regions at the surface of device 10. A vertical bipolar transistor is formed by regions 167, 16 and 26. Transistor regions 167 and 16 are shorted through region 166 by contact structure 41. Likewise, a vertical bipolar transistor is formed by regions 197, 19 and 26. Transistor regions 197 and 19 are shorted through region 196 by contact structure 43. This feature provides, among other things, a reduced parasitic capacitance associated with reduced minority carrier storage. Additionally, this feature enables a more ideal avalanche characteristic during operation.

Figure 3:
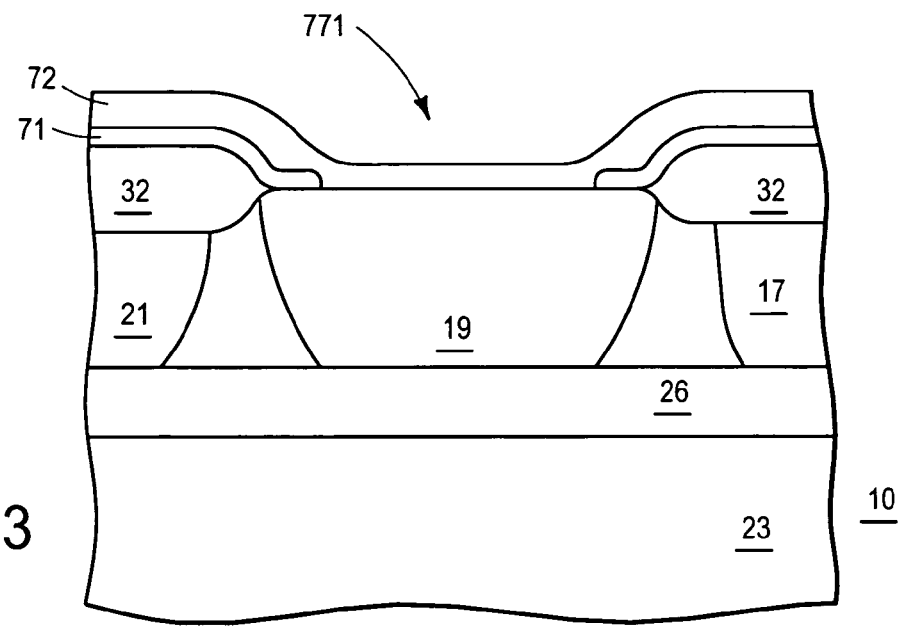
FIGS. 3–8 illustrate a preferred process flow for forming an ESD structure according to the present invention.

FIGS. 3–8 illustrate enlarged cross-sectional views of structure 10 to show preferred steps of forming polycrystalline layers 72 and 76 and contact regions 196 and 197. Only second region 19 is shown for simplicity. Similar steps are used to form contact regions 166 and 167 in first region 16. FIG. 3 shows structure 10 after the formation of second region 19 in layer 27 and the formation of ILD layer 71. An opening 771 is formed in ILD layer 71 using conventional photolithographic and etch techniques.

Next, polycrystalline semiconductor layer 72 is deposited over ILD 71 and opening 771. By way of example, layer 72 comprises a polysilicon layer approximately 3,000 to 4,000 angstroms thick. Layer 72 is either doped p-type during deposition, or is undoped and subsequently doped using, for example, ion implantation or deposition techniques. For example, a boron implant with an implant dose on the order of $1.0 \times 10^{15}$ to $4.0 \times 10^{15}$ atoms/cm$^2$ is sufficient.

Figure 4:
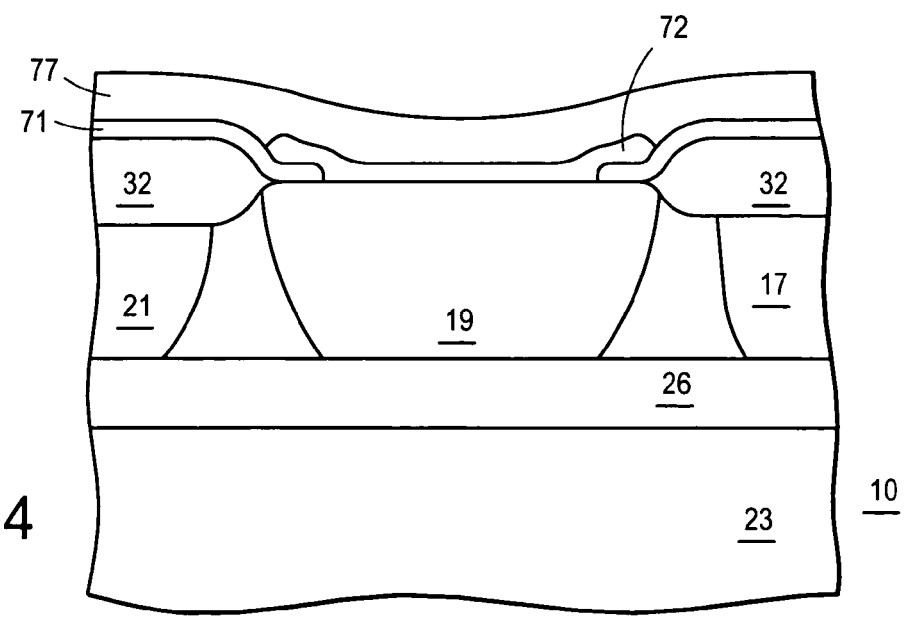

Thereafter, as shown in FIG. 4, layer 72 is patterned, and a second ILD layer 77 is formed or deposited over layer 72 and portions of ILD layer 71. For example, ILD layer 77 comprises an oxide, a nitride, or combinations thereof. Preferably, ILD layer 77 comprises a first layer of silicon nitride followed by a second layer of silicon oxide. A silicon nitride layer on the order of 250 to 500 angstroms followed by a silicon oxide layer on the order of 6,000 to 7,000 angstroms is sufficient.

Figure 5:
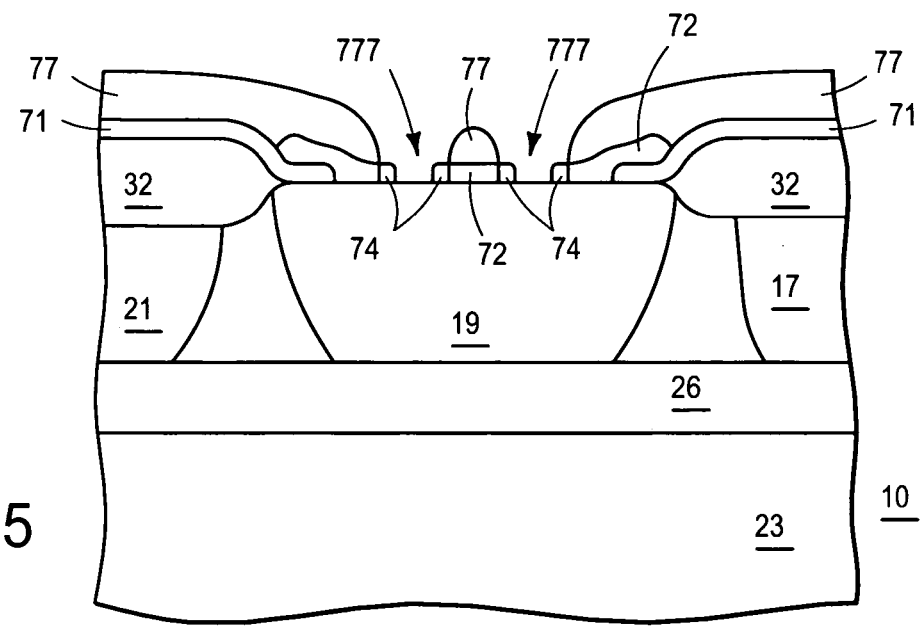
Figure 6:
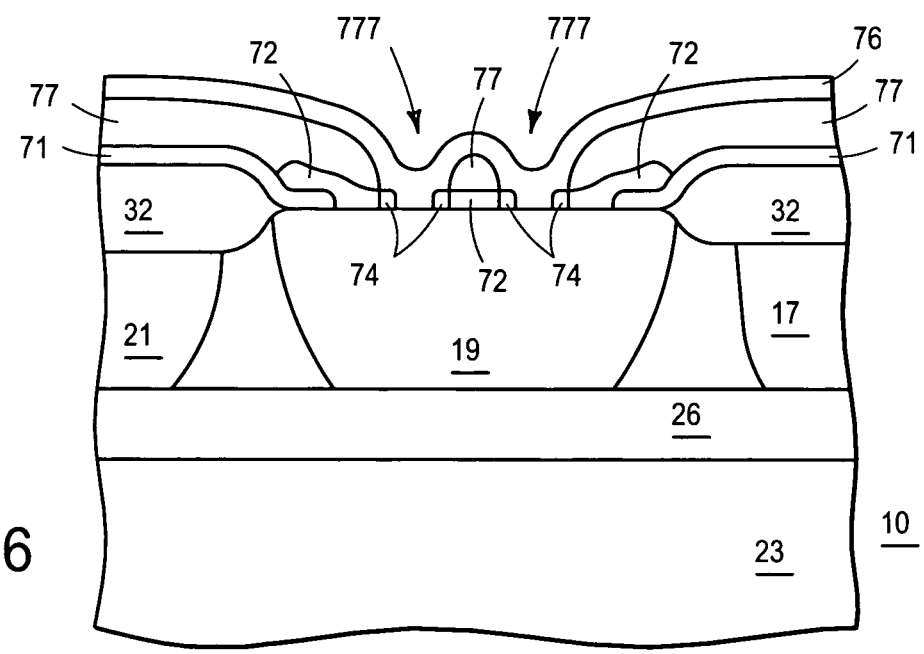

FIG. 5 shows structure 10 after further processing. Specifically, a photolithographic and etch step is used to form openings 777 in ILD layer 77 and layer 72. Next, a conventional dielectric spacer process is used to form dielectric spacers 74 along sidewall regions of layer 72. Spacers 74 preferably comprise a silicon oxide, and function to electrically isolate the ends of layer 72. A second polycrystalline semiconductor layer 76 is then formed over structure 10 and within openings 777 as shown in FIG. 6. Preferably, layer 76 comprises polysilicon, and is approximately 2,500 to 4,000 angstroms thick. Layer 76 is either doped n-type during deposition, or is undoped and subsequently doped using, for example, ion implantation or deposition techniques. For example, an arsenic implant (or the like) with an implant dose on the order of $1.0 \times 10^{16}$ to $2.0 \times 10^{16}$ atoms/cm$^2$ is sufficient.

Figure 7:
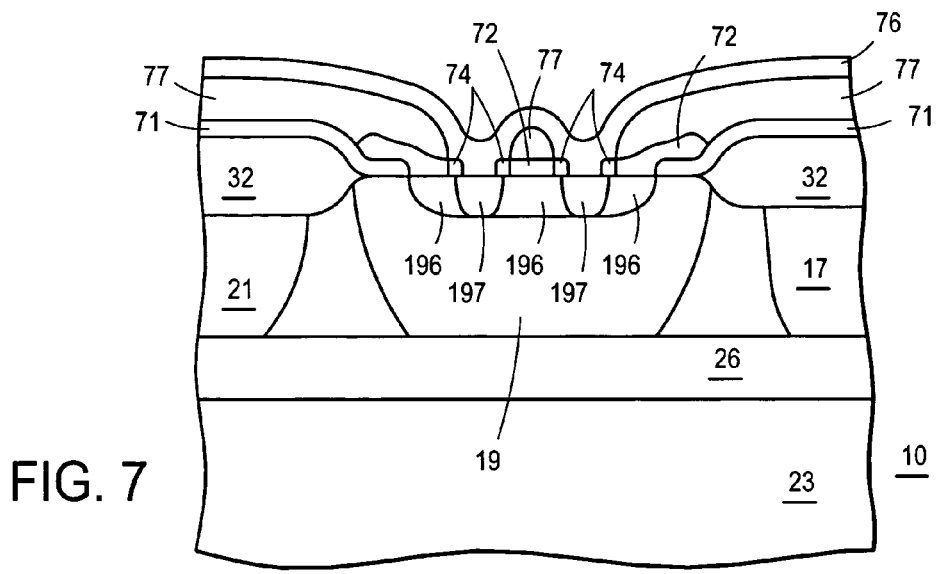
Figure 8:
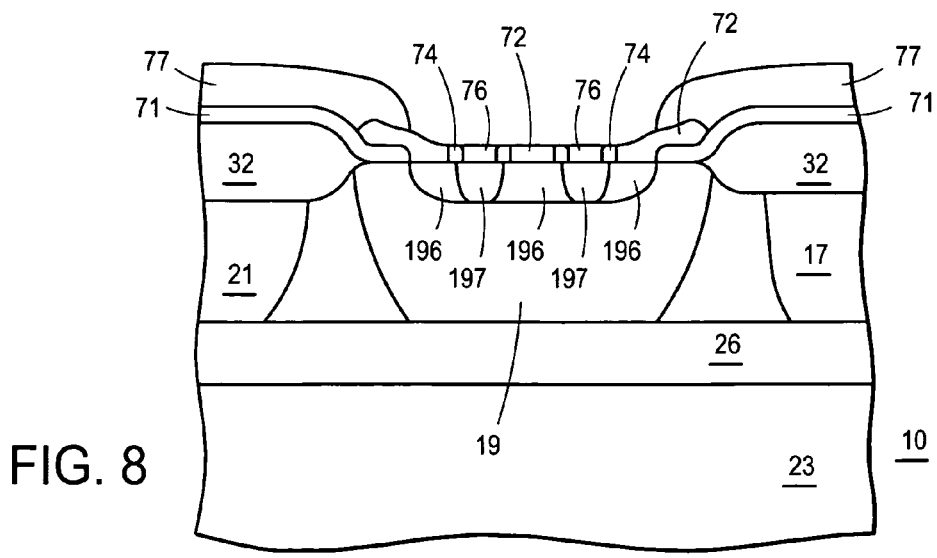

Next, structure 10 is exposed to an elevated temperature to form contact regions 196 and 197 as shown in FIG. 7. For example, structure 10 is exposed to about 1,000 to 1,100 degrees Celsius for approximately 20 to 50 seconds. During the high temperature process, p-type dopant in layer 72 and n-type dopant in layer 76 diffuse into diode region 19 to form p-type regions 196 and n-type regions 197. Layer 76 is then planarized or etched back, and ILD layer 77 is etched using conventional photolithographic and etch techniques to provide structure 10 as shown in FIG. 8.

Referring back now to FIG. 2, a first metal or conductive layer 81 is then formed over structure 10. First conductive layer 81 comprises for example, a platinum silicide or the like. In one embodiment, platinum is deposited over structure 10, and then annealed in a nitrogen ambient to form a platinum silicide where first conductive layer 81 contacts polycrystalline semiconductor layers 72 and 76. A second metal or conductive layer 83 is then deposited over first conductive layer 81. Second conductive layer 83 comprises, for example, a titanium layer, followed by a titanium nitride barrier layer, followed by an aluminum copper layer, or the like. Both layers 83 and 81 are then patterned using conventional techniques. Once patterned, contact structure 41 comprising portions of layers 72, 76, 81 and 84 is formed.

Next, a third ILD layer 86 is formed over structure 10. ILD layer 86 comprises, for example, a silicon oxide deposited using a tetraethyl orthosilicate (TEOS) source, and has a thickness on the order of 15,000 to 20,000 angstroms. An opening or via is then formed in ILD layer 86 over second region 19 to provide a contact opening thereto. A third metal or contact layer 91 is then formed over structure 10 and patterned to complete contact structure 43, which comprises portions of layer 72, 76, 81, 84, and 91. Third contact layer 91 comprises, for example, an aluminum-copper layer, and has a thickness on the order of 14,000 to 16,000 Angstroms. An optional final passivation layer (not shown) is deposited over structure 10 and preferably comprises a doped oxide (e.g., PSG), a nitride, or combinations thereof. Openings are then formed in the final passivation layer and additional conductive layers or structures (e.g., bumps) are formed. Under IEC level 4 contact discharge, structure 10 showed a greater than 25,000 volt capability.

During operation, structure 10 according to the present invention provides minimal parasitic effects. More specifically, device 10 draws very little current, and has minimal capacitive effects compared to prior art ESD structures. Also, structure 10 protects for both positive and negative ESD events. For a positive ESD trigger event, a positive voltage is applied to contact structure 43 with respect to contact structure 41. The diode formed by regions 19 and 26 is forward biased; however, no current flows until the diode formed by regions 16 and 26 avalanches. Once avalanche occurs, equal numbers of holes and electrons are generated at the junction of regions 16 and 26. The holes flow out of structure 10 by way of regions 166. The electrons flow through buried layer 26 to provide the forward bias current of the diode formed by regions 19 and 26, and out structure 10 mostly through regions 197.

Under a negative ESD trigger event, a negative voltage is applied to contact structure 43 with respect to contact structure 41. The diode formed by regions 16 and 26 is forward biased; however, no current flows until the diode formed by regions 19 and 26 avalanches. Once avalanche occurs, equal numbers of holes and electrons are generated at the junction of regions 19 and 26. The holes flow out of structure 10 by way of regions 196. The electrons flow through buried layer 26 to provide the forward bias current of the diode formed by regions 16 and 26, and out of structure 10 mostly through regions 167.

Another advantage of structure 10 is that the avalanche region (i.e., the region defined by regions 16 and 26 or regions 19 and 26) is buried within a semiconductor region (i.e., within regions 23 and 27), and is away from an outer surface where leakage currents can be generated. This minimizes voltage drift during operation and provides a more stable device.

In summary, structure 10 comprises an annular, annulated, concentric circle and/or ring ESD device for extreme ESD events that includes a buried sub-surface back-to-back diode structure. The buried sub-surface structure eliminates or reduces breakdown voltage drift and provides a low on-resistance to better protect ESD sensitive circuits. Changing the dopant profile of first and second regions 16 and 19 conveniently controls the avalanche breakdown voltage of structure 10. For example, the ion implantation dose or deposition concentration is changed to modify the dopant profile of first and second regions 16 and 19. Also, the annular structure provides a reduced series resistance to current flowing through region 26.

Structure 10 includes a floating buried region 26 and an isolation region 17 to minimize any SCR action. Also, buried region 26 and outer isolation ring 14 provide improved extrinsic device isolation. Additionally, floating buried region 26 and inner isolation region 21 provide an improved current ballasting and potential equalization, which among other things minimizes hot spot formation. In addition, the circular/ring structure of device 10 provides for an optimum electric field distribution and current flow shaping% The circular/ring structure also takes up less space and allows for an even distribution of mechanical stresses to improve reliability of bumped I/O pads. Furthermore, structure 10 has low input capacitance due to the series connection of first and second regions 16 and 19. Moreover, the back-to-back diode structure provides for temperature compensation of the breakdown or ESD trigger voltage or stability over a wide temperature range.

Thus it is apparent that there has been provided, in accordance with the present invention, an ESD structure for extreme ESD conditions. In addition, a preferred method for forming the ESD structure has been provided.

Although the invention has been described and illustrated with reference to specific embodiments thereof, it is not intended that the invention be limited to these illustrative embodiments. For example, contact regions 166, 167, 196, and 197 can be formed by ion implantation or deposition directly into first and second regions 16 and 19. Additionally, isolation regions 14, 17, and 21 may comprise diffused isolations, trench isolations, combination thereof, or the like. Moreover, field isolation regions 32 may be formed before forming isolation regions 14, 17, and 21. In such an embodiment, openings are formed in field isolation regions 32 using conventional techniques. Isolation regions 14, 17, and 21 are then formed through the openings. ILD layer 71 provides passivation over isolation regions 14, 17, and 21 in such an embodiment. Those skilled in the art will recognize that modifications and variations can be made without departing from the spirit of the invention. Therefore, it is intended that this invention encompass all such variations and modifications as fall within the scope of the appended claims.

We claim:

1. A semiconductor ESD structure comprising:
   a semiconductor substrate of a first conductivity type having a first region of a second conductivity type and a first dopant concentration;
   a buried region of the second conductivity type formed in the first region;
   a second region of the first conductivity type formed in the first region and contacting the buried layer;
   a third region of the first conductivity type formed in the first region and contacting the buried layer;
   a first isolation region formed in the first region between the second and third regions, wherein the second and third regions and first isolation region form concentric rings in the first region;
   a first pair of oppositely doped regions formed in the second region; and
   a second pair of oppositely doped regions formed in the third region.

2. The structure of claim 1 wherein the first isolation region comprises a diffused region having a second dopant concentration greater than the first dopant concentration.

3. The structure of claim 2 wherein the first isolation region comprises the second conductivity type and has a surface dopant concentration of greater than about $1.0 \times 10^{18}$ atoms/cm$^3$.

4. The structure of claim 1 wherein the first isolation region extends through the first region and contacts the buried region.

5. The structure of claim 1 wherein the first region comprises an epitaxial layer.

6. The structure of claim 1 wherein the first pair of oppositely doped regions are shorted together.

7. The structure of claim 1 wherein the second pair of oppositely doped regions are shorted together.

8. The structure of claim 1 further comprising:
   a second isolation region formed in the first region adjacent the second region; and
   a third isolation region formed in the first region adjacent the third region.

9. The structure of claim 8 wherein the second and third isolation regions extend to the buried region.

10. The structure of claim 1 wherein one region of the first pair of oppositely doped regions has a resistance that is about twice that of the other region in the first pair.

11. The structure of claim 1 wherein one region in the second pair of oppositely doped regions has a resistance that is about twice that of the other region in the second pair.

12. The structure of claim 1 further comprising a fourth isolation region formed in the first region and surrounding the buried region, the second and third regions, and the first isolation region.

13. The structure of claim 1 wherein the buried region, the second region, and the third region form a temperature compensated device.

14. The structure of claim 1 wherein the buried region and the second region form a buried avalanche region.

15. The structure of claim 1 wherein the buried region and the third region form a buried avalanche region.

16. The structure of claim 1 whereon one of the first pair of oppositely doped regions and the second pair of oppositely doped regions is shorted together to provide a reduced capacitance device.

17. The structure of claim 1 wherein the buried region and the second region generate a $V_{BE}$ voltage and the buried region and the third region generate an avalanche voltage during an ESD trigger event.

18. The structure of claim 1 wherein the buried region and the third region generate a $V_{BE}$ voltage and the buried region and the second region generate an avalanche voltage during an ESD trigger event.

19. A semiconductor device comprising:
a first ring region of a first conductivity type formed in a layer semiconductor material of a second conductivity type and having a first doping concentration;
a second ring region of the first conductivity type formed in the layer of semiconductor material;
a first doped region of the second conductivity type within the layer of semiconductor material and coupled to the first and second ring regions; and
a third ring region comprising an isolation region between the first and second ring regions.

20. The device of claim 19 wherein the third ring contacts the first doped region.

21. The device of claim 19 further comprising:
a second doped region of the first conductivity type formed in the first ring; and
a third doped region of the second conductivity type formed in the first ring.

22. The device of claim 21 further comprising:
a fourth doped region of the first conductivity type formed in the second ring region; and
a fifth doped region of the second conductivity type formed in the second ring region.

23. The device of claim 19 further comprising:
a first contact structure coupled to the first ring region; and
a second contact structure coupled to the second ring region.

24. The device of claim 23 wherein one of the first and second contact structures includes a polycrystalline semiconductor material.

25. The device of claim 19 wherein the first doped region comprises a buried region.

26. The device of claim 19 further comprising a fourth ring region comprising an isolation region formed in the layer of semiconductor material adjacent the first ring region and contacting the first doped region.

27. The device of claim 19 further comprising a fifth region comprising an isolation region formed in the layer of semiconductor material adjacent the second ring region and contacting the first doped region.

28. The device of claim 19 wherein the first, second, and third ring regions are substantially concentric.

29. The device of claim 19 wherein the third ring region comprises a diffused region having a second dopant concentration greater than the first dopant concentration.

30. The device of claim 19 wherein one of the third ring region, fourth ring region, and fifth ring region comprises a passivated trench.

* * * * *